(12) United States Patent
Corvasce et al.

(10) Patent No.: US 10,629,714 B2
(45) Date of Patent: Apr. 21, 2020

(54) INSULATED GATE BIPOLAR TRANSISTOR

(71) Applicant: ABB Schweiz AG, Baden (CH)

(72) Inventors: Chiara Corvasce, Bergdietikon (CH); Arnost Kopta, Zürich (CH); Maxi Andenna, Dättwil (CH); Munaf Rahimo, Gänsbrunnen (CH)

(73) Assignee: ABB Schweiz AG, Baden (CH)

( * ) Notice: Subject to any disclaimer, the term of this patent is extended or adjusted under 35 U.S.C. 154(b) by 1 day.

(21) Appl. No.: 16/156,457

(22) Filed: Oct. 10, 2018

(65) Prior Publication Data
US 2019/0109218 A1 Apr. 11, 2019

(30) Foreign Application Priority Data
Oct. 10, 2017 (EP) .................... 17195630

(51) Int. Cl.
H01L 29/66 (2006.01)
H01L 29/739 (2006.01)
H01L 29/06 (2006.01)
H01L 29/10 (2006.01)
H01L 21/265 (2006.01)
H01L 21/266 (2006.01)
(Continued)

(52) U.S. Cl.
CPC ...... *H01L 29/7397* (2013.01); *H01L 21/2253* (2013.01); *H01L 21/266* (2013.01); *H01L 21/26513* (2013.01); *H01L 21/324* (2013.01); *H01L 29/0619* (2013.01); *H01L 29/0696* (2013.01); *H01L 29/1083* (2013.01); *H01L 29/1095* (2013.01); *H01L 29/402* (2013.01); *H01L 29/408* (2013.01); *H01L 29/66348* (2013.01)

(58) Field of Classification Search
CPC ..................... H01L 29/7397; H01L 29/66348
See application file for complete search history.

(56) References Cited

U.S. PATENT DOCUMENTS

| 9,105,680 B2 | 8/2015 | Andenna et al. |
| 2015/0060937 A1 | 3/2015 | Hikasa |
| 2016/0211354 A1 | 7/2016 | Ikura |

FOREIGN PATENT DOCUMENTS

| EP | 2523217 A1 | 11/2012 |
| JP | 2013030539 A | 2/2013 |

(Continued)

OTHER PUBLICATIONS

European Patent Office, Search Report issued in corresponding Application No. 17195630.3, dated Dec. 12, 2017, 5 pages.

*Primary Examiner* — Grant S Withers
(74) *Attorney, Agent, or Firm* — Taft Stettinius & Hollister LLP; J. Bruce Schelkopf

(57) ABSTRACT

An IGBT is provided with at least two first cells, each of which have an n doped source layer, a p doped base layer, an n doped enhancement layer. The base layer separates the source layer from the enhancement layer, an n-doped drift layer and a p doped collector layer. Two trench gate electrodes are arranged on the lateral sides of the first cell. The transistor includes at least one second cell between the trench gate electrodes of two neighboring first cells, which has on the emitter side a p+ doped well and a further n doped enhancement layer which separates the well from the neighboring trench gate electrodes. An insulator layer stack is arranged on top of the second cell on the emitter side to insulate the second cell and the neighboring trench gate electrodes from the metal emitter electrode.

20 Claims, 12 Drawing Sheets

(51) Int. Cl.
*H01L 21/225* (2006.01)
*H01L 21/324* (2006.01)
*H01L 29/40* (2006.01)

(56) References Cited

FOREIGN PATENT DOCUMENTS

| | | |
|---|---|---|
| WO | 2012113818 A2 | 8/2012 |
| WO | 2013004829 A1 | 1/2013 |

INSULATED GATE BIPOLAR TRANSISTOR

FIELD OF INVENTION

The invention relates to the field of power semiconductor devices. It relates to an Insulated Gate Bipolar according to the preamble of claim 1.

BACKGROUND OF THE INVENTION

Prior art IGBTs having trench MOS cells designs as shown in FIG. 1 have a trench gate electrode 7 with a gate layer 70, which is electrically insulated from a p doped base layer 3, an n+ doped source layer 2 and an n− doped drift layer 5 by a gate insulating layer 72. The trench gate electrode 7 is arranged in the same plane and lateral to the base layer 3 and extends deeper into the drift layer 5 than the base layer 3.

With such trench gate electrode designs, the on-state losses are lower than for planar gate designs, because the trench design offers a vertical MOS channel, which provides enhanced injection of electrons in the vertical direction and suffers from no drawbacks from charge spreading (so called JFET effect) near the cell. Therefore the trench cells show much improved carrier enhancement for lower losses. Due to the vertical channel design, the trench offers also less hole drain effect (PNP effect) due to the improved electron spreading out of the MOS channel than for planar gate designs. At the bottom of the trench there is an accumulation layer, which offers strong charge enhancement for the PIN diode part. Hence wide and/or deep trenches show optimum performance. The trench design offers large cell packing density for reduced channel resistance. The trench design, however, suffers from lower blocking capability near the bottom corners of the trenches due to high peak electric fields. The trench design has a large MOS accumulation region below the trench gate and associated capacitance with difficulty to apply field oxide type layers in the trench for Miller capacitance reduction. Therefore, the prior art device as shown in FIG. 1 results in bad controllability and high switching losses. Furthermore, the high cell densities in trench designs will result in high short circuit currents.

In order to reduce above mentioned effects, the trench gate electrodes 7 have been made wide and deep, whereas the cells have to be made narrow, so that losses are reduced and short circuit current can be kept low. However, such trenches are difficult to process and will still suffer from bad controllability.

In a further prior art concept shown in FIG. 2, IGBTs having a pitched-trench gate electrode design has been applied, in which a MOS area is inserted between the cells. The two trench gate electrodes 7, 7' are connected by a layer 700 made of the same material as the trench gate electrodes 7, 7', thereby forming an area below, in which a part of the base layer 3 is arranged, but no source layer or contact of the base layer to the emitter electrode is available in this MOS area. However, such devices result in bad blocking properties and high switching losses due to slow field spreading from the pitched area during switching.

In another approach shown in FIG. 3, dummy trench cells 110 have been introduced into another prior art IGBT, in which active cells 100, 100' and dummy cells 110 are arranged in an alternating manner. The base layer 3 and source layer 2 do not have a contact to the emitter electrode 9 in the dummy cell 110, However, similar problems to those mentioned for the pitched-trench design apply.

In U.S. Pat. No. 9,105,680 B2 (FIG. 4) another prior art IGBT having trench gate electrodes 7, 7' is described. Between two active trenches 7, 7' a dummy cell 110' is arranged with a further source layer 20 connected to each trench gate electrode 7, 7' and a further base layer 30 and a further enhancement layer 40 separating the further base layer 40 from the drift layer 5. In the central part of the dummy cell 110, a deep p well 8 is arranged, which is separated from the further base layer 3 by the further enhancement layer 40, which further enhancement layer 40 extends to the emitter sided surface of the device. On top of the p well 8, a thin, only 50 to 150 nm thick insulating film 77 is arranged. The insulating film 77 is covered by a grounded poly silicon plate 78, which is directly connected to the emitter electrode 9 at a recess of the top insulating layer. Due to the thin insulating film 77 the p well capacity is connected to the emitter electrode 9 via the grounded poly silicon plate 78, the switching capability can be improved. However, in the prior art device known from U.S. Pat. No. 9,105,680 B2 the accumulation of holes during turn-on switching in the dummy area results in an increase of the Miller capacitance with the consequent loss of turn-on controllability.

From WO 2013/004829 A1 and EP 2 523 217 A1 prior art IGBTs are known, which have a dummy cell, which is coupled to the emitter electrode by a polysilicon plate, which is connected to the emitter electrode and which is weakly coupled to a well by an insulating layer in between.

Although in EP 2 523 217 A1, the connection of the poly plate to the emitter electrode is claimed to be as well effective for controllability, on condition to have an oxide of at least 300 nm underneath the poly, the manufacturing process inherently limits the maximum oxide thickness to be manufactured in only one thermal oxidation.

Moreover in EP 2 523 217 A1, the polysilicon plate has a higher resistivity than the metal emitter electrode, which results in a lateral potential drop between the edge of the polysilicon plate and the metal electrode which may negatively influences the coupling effect and the electric field at the lateral edges of the polysilicon plate.

DESCRIPTION OF THE INVENTION

It is an object of the invention to provide a power semiconductor device with improved controllability. The problem is solved by the semiconductor device with the characteristics of claim 1.

The inventive device integrates both active trench and well layers separated from the metal emitter electrode in a dummy cell as a single structure in order to achieve improved controllability performance while maintaining the advantages of reduced on-state and switching losses and improved blocking of the P-well trench IGBT cell. In the inventive design the dummy well layer is only capacitive coupled to the emitter potential and the coupling is weakened by the introduction of a thick insulating layer stack with low capacitance in the dummy region. In addition the presence of the further enhancement layer, having a much larger doping concentration than the drift region, for separating the well from the trench gate electrode in the dummy region, further reduces the amount of holes which can accumulate during the turn-on switching in the dummy cell. Such positive charge can directly connects the gate trench to the P-well and effectively contributes to the Miller capacitance increase.

By the inventive structure the Miller capacitance contribution of the dummy regions is minimized to improve controllability during turn-on switching.

Thus, in the inventive device the inversion charge is minimized by reducing the oxide capacitance (due to an increase of the insulating layer stack thickness on top of the well) and by increasing the doping of an n doped layer between the well and the gate electrodes, i.e. by the introduction of a further enhancement layer having a higher doping than the drift layer. These layers can be manufactured using the same or self-aligned masks, in which the first insulating layer serves as mask, in which a dopant is absorbed, whereas in the openings of such insulating layers the dopants can enter into or onto the wafer.

This structure exploits all the positive effects of the deep well between two active cells for an optimum trade-off among controllability, low switching losses and blocking capability. The enhancement layer itself also has the advantage that the on-state losses are reduced. The inventive IGBT has good electrical properties for both the static and dynamic characteristics.

FIG. 7 shows turn-on behavior for an inventive device compared to a prior art device as known form FIG. 4. For the voltage, the voltage decreases with a shallower slope for the inventive device. Concerning the collector current $I_{ce}$, the inventive device shows less overcurrent combined with lower turn-on speed, which leads to a better turn-on controllability. FIG. 8 shows the different extent of hole accumulation in the dummy region compared for the inventive and prior art device during the turn on switching, after the gate voltage has risen over the Vth value and the IGBT starts to conduct. On the left handed side of the figure, the charge rises from the surface of the gate insulating layer, on the right handed side of the figure, the charge saturates within the well. The inventive device proves to have a tremendous reduction of hole current density (charge) in the dummy cell area.

The proposed structure and its manufacturing process are advantageous in providing full flexibility in designing the dielectric thickness stack (insulating layer stack) to decouple the emitter metal.

The inventive design is suitable for full or part stripes but can also be implemented in cellular designs.

Further advantages according to the present invention will be apparent from the dependent claims.

BRIEF DESCRIPTION OF THE DRAWINGS

The subject matter of the invention will be explained in more detail in the following text with reference to the attached drawings, in which.

The reference symbols used in the figures and their meaning are summarized in the list of reference symbols. Generally, alike or alike-functioning parts are given the same reference symbols. The described embodiments are meant as examples and shall not confine the invention.

DETAILED DESCRIPTION OF PREFERRED EMBODIMENTS

Figure 5:
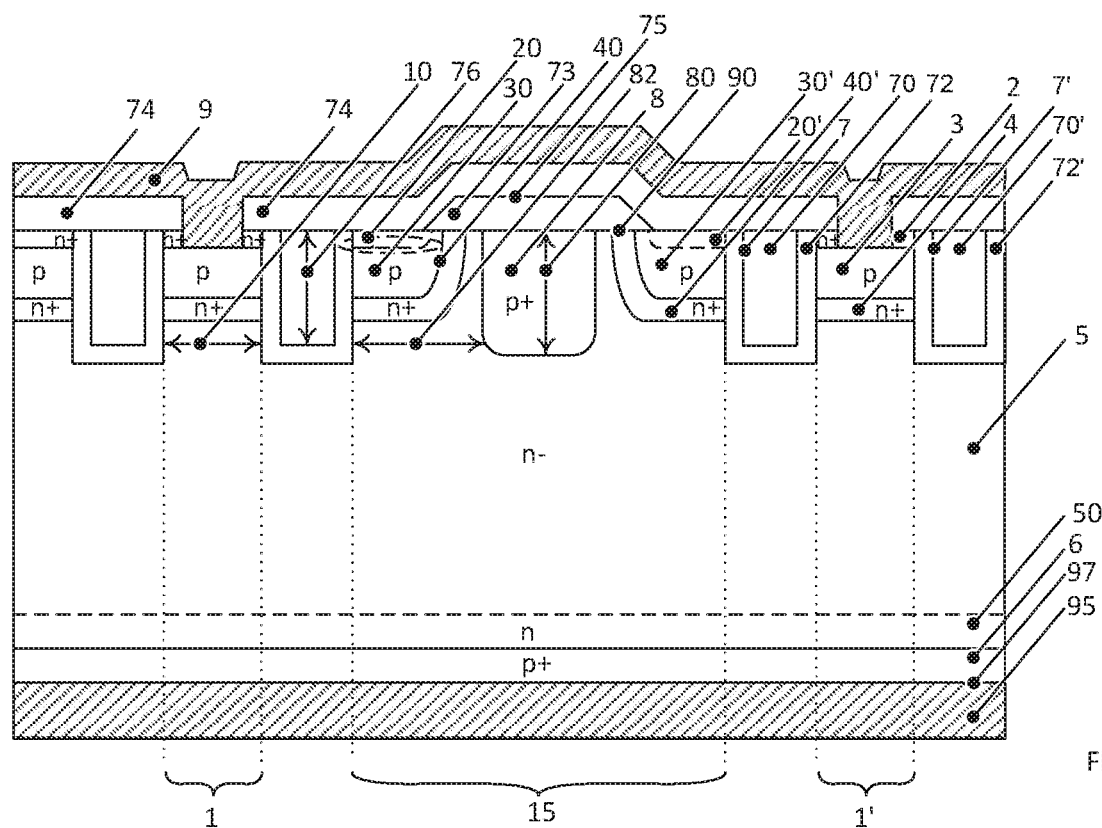
FIG. 5 shows a first exemplary embodiment of an IGBT according to the invention.

FIG. 5 shows a first embodiment of an inventive power semiconductor device 1 in form of an insulated gate bipolar transistor (IGBT) with a four-layer structure (pnpn). The inventive IGBT comprises at least two first cells 1, 1', each of which having following layers from a metal emitter electrode 9 on an emitter side 90 and a collector electrode 95 on a collector side 97 opposite to the emitter side 90:

an n doped source layer 2 (n being in this example a first conductivity type). The first source layer 2 has a higher doping concentration than a drift layer 5.

a p doped base layer 3 (p being in this example a second conductivity type, which is different from the first conductivity type), wherein the source layer 2 and the base layer 3 contact the metal emitter electrode 9. The source layer 2 is arranged on the base layer 3, which shall mean that the source layer 2 is arranged at the surface of the device at the emitter side 90. The source layer 2 may be embedded in the base layer 3 towards the bottom side and lateral sides such that both layers have a common surface on the emitter side 90 or the source layer 2 may be arranged on the base layer 3, it may be arranged completely on top of the base layer 3 such that the bottom side of the source layer 2 touches the top side of the base layer 3 towards the emitter side 90.

an n doped enhancement layer 4 having higher doping concentration than the drift layer 5, wherein the base layer 3 separates the source layer 2 from the enhancement layer 4, an n– doped drift layer 5, wherein the enhancement layer 4 separates the base layer 3 from the drift layer 5. Exemplarily, the drift layer 5 has a constant, uniform low doping concentration.

a p doped collector layer 6, which is arranged between the drift layer 5 and the collector electrode 95 and which electrically contacts the collector electrode 95, two trench gate electrodes 7, 7', each of which comprises an electrically conductive gate layer 70, 70', which is arranged lateral to the base layer 3, extends deeper into the drift layer 5 than the base layer 3 and has a gate layer thickness 76, and a gate insulating layer 72, 72', which separates the gate layer 70, 70' from any doped layer (i.e. the source layer 2, the base layer 3, the enhancement layer 4 and the drift layer 5). A MOS channel is formable between the source layer 2, the base layer 3, the enhancement layer 4 and the drift layer 5. The trench gate electrodes 7, 7' may have any design well-known to the experts like cellular design, full or part stripes.

The metal emitter electrode 9 and the collector electrode 95 are metal electrodes, which may be made of one metal or of a metal alloy or a stack of metals such as aluminium, titanium, chromium, silver, nickel, gold not excluding other electrically conductive metals. The inventive device avoids the presence of a polysilicon plate at the emitter electrode 9, i.e. the emitter electrode 9 is a pure metal emitter electrode.

The inventive IGBT comprises at least one second cell 15 (acting as a dummy cell), which is arranged between two neighboured first cells 1, 1' and which has following layers on the emitter side 90:

- a p+ doped well 8, which is arranged between two trench gate electrodes 7, 7' of the neighboured first cells 1, 1', which well 8 has a well thickness 80, which extends at least to the gate layer thickness 76, i.e. the well 8 extends in depth direction, which shall lie perpendicular to the emitter side 90, at least to such depth, to which the deepest gate layers 70, 70' extend. Exemplarily, the well 8 extends to a greater depth than the gate layers 70, 70'.
- n doped further enhancement layers 40, 40', which have a higher doping concentration than the drift layer 5 and which are arranged between the well 8 and each of the two neighboured trench gate electrodes 7, 7' (of the neighboured first cells 1, 1') such that the further enhancement layers 40, 40' extend to the emitter side 90. Exemplarily, the further enhancement layers 40, 40' are shallower than the well 8. The further enhancement layers 40, 40' prevent that the holes accumulate in the dummy cell. The further enhancement layers 40, 40' extends from the neighboured trench gate electrodes 7, 7' (i.e. from their side walls) to the first main side 90 between the well 8 and said trench gate electrode 7, 7'.

An insulator layer stack 75 is arranged on top of the second cell 15 on the emitter side 90 to insulate the second cell 15 and the neighboured trench gate electrodes 7, 7' from the metal emitter electrode 9. The insulator layer stack 75 consists of a first insulating layer 73 and a second insulating layer 74, wherein the insulator stack 75 has a thickness on top of the well 8 of a first layer thickness plus the second insulating layer thickness and a thickness on top of the gate layer 70, 70' of the second insulating layer thickness, wherein each thickness of the first and second insulating layer is at least 700 nm (i.e. in total the insulator stack 75 has a thickness on top of the well 8 of at least 1400 nm). By such a thick insulating layer stack, a capacitance of the layer stack 75 is less than 2.5 nF/cm$^2$ (which corresponds to an insulating layer stack thickness of 1400 nm). Such a low capacitance of the insulating layer stack 75 ensures a good electrical insulation towards the metal emitter electrode 9 to prevent a capacitive coupling to the metal emitter electrode 9. The insulating layer stack 75 has a thickness of at least 1400 nm on top of the well and a thickness of at least 700 nm on top of the gate electrodes 7, 7' and on top of the further base layer 30, 30' (at least in a region of the further base layer 30, 30' attached to the gate electrodes 7, 7'). Thus, the insulating layer stack thickness is higher on top of the well 8 than on top of the gate electrodes 7, 7' and further base layer 30, 30'.

In the inventive IGBT shown in FIG. 5 the drift layer 5 extends to the second insulating layer 74 in an area between the well 8 and the further enhancement layers 40, 40'. In another exemplary embodiment, the drift layer 5 has a doping concentration between $1*10^{12}$ to $1*10^{14}$ cm$^{-3}$.

Figure 6:
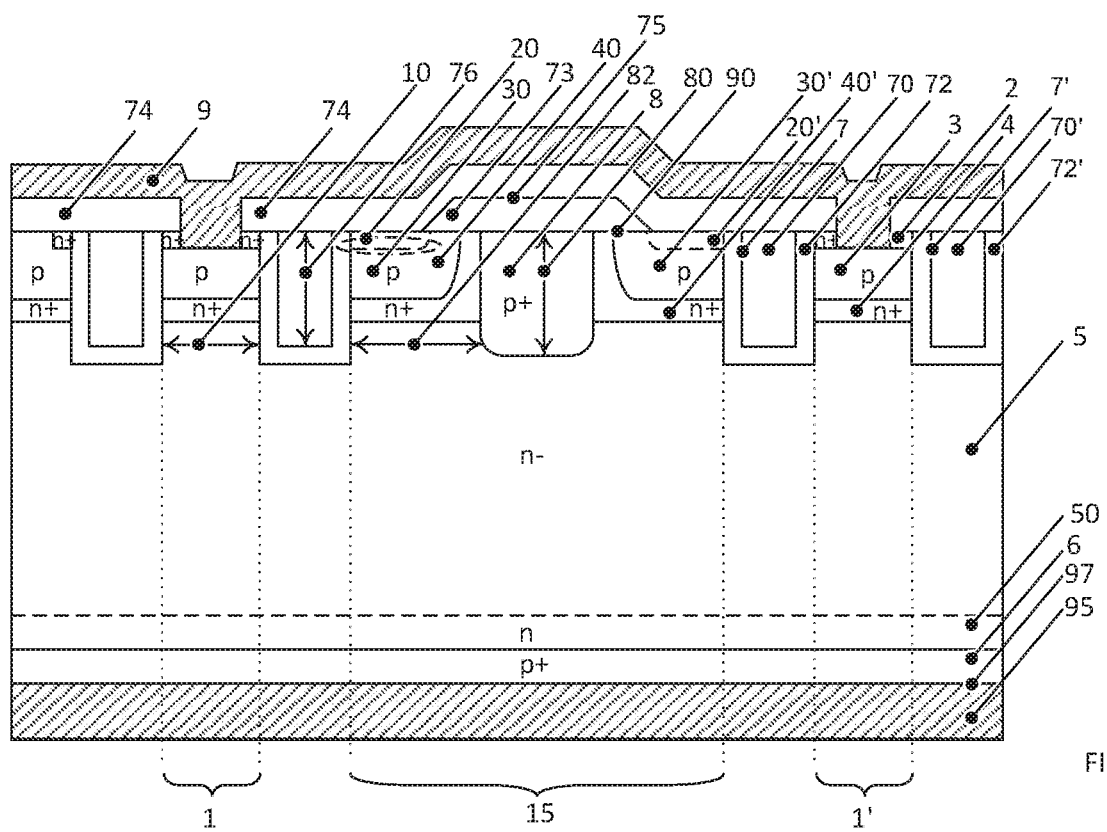
FIG. 6 show another exemplary embodiment of an IGBT according to the invention.
Figure 7:
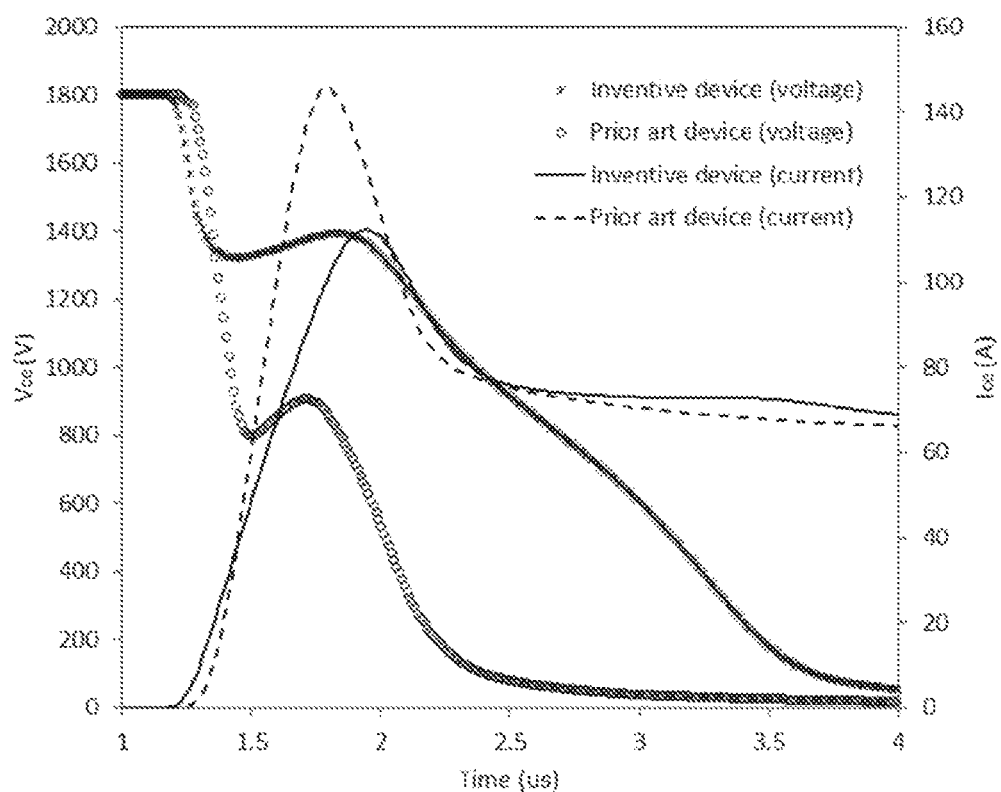
FIG. 7 shows voltage and current for an inventive device and the prior art device as known from FIG. 4.
Figure 8:
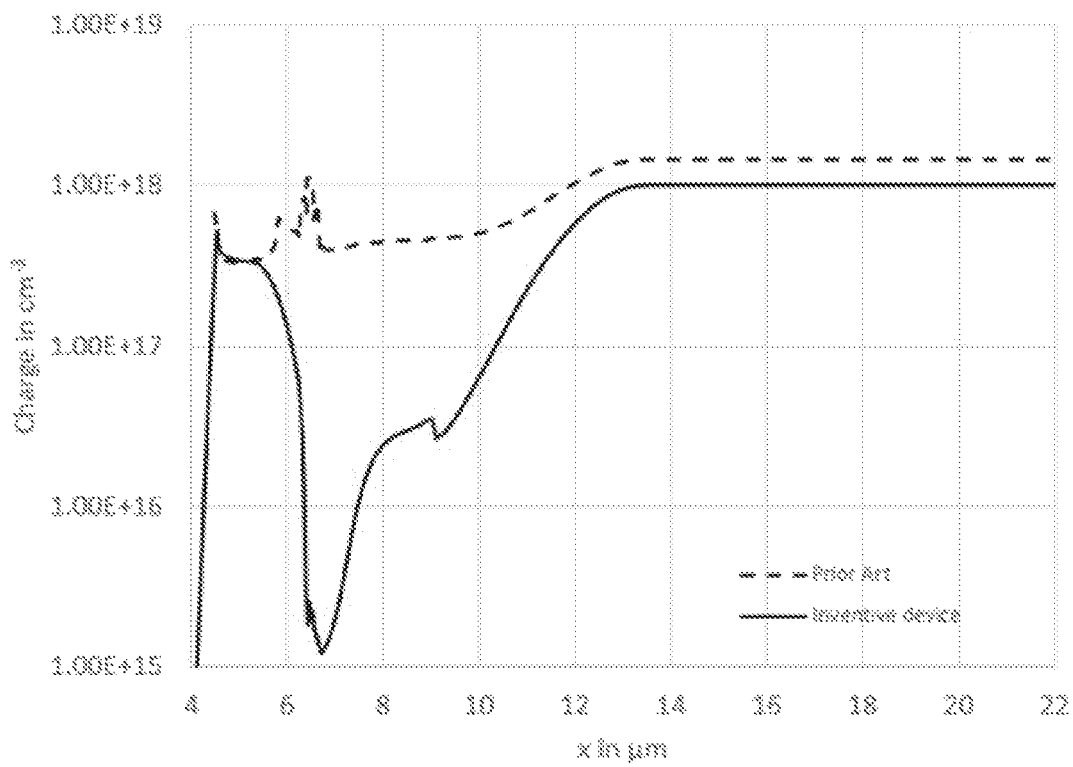
FIG. 8 shows hole current density at the maximum Ice current slope dIce/dt during the turn-on switching in a region just below the second insulating layer in the second cell area as indicated in FIG. 5 by the dashed oval line.

In the FIG. 6 another inventive IGBT similar to the one shown in FIG. 5 is disclosed, which comprises an additional feature of the further enhancement layers 40, 40' adjoining the well layer 8. This allows to have a very compact cell structure, i.e. minimizing the space (i.e. width of the second cell 15, which is the extension of the second cell 15 between two first cells 1, 1') between the active first cells 1, 1'.

In another exemplary embodiment, the enhancement layer 4 and the further enhancement layers 40, 40' have a maximum doping concentration between $5*10^{15}$ to $5*10^{16}$ cm$^{-3}$. The enhancement layer 4 and the further enhancement layers 40, 40' may have the same maximum doping concentration. The base layer 4 and further base layers 40, 40' may extend to the same depth.

In another inventive embodiment, further p doped base layers 30, 30' are arranged in the second cell 15 and adjoin the neighboured trench gate electrodes 7, 7', wherein the further enhancement layers 40, 40' separate the further base layers 30, 30' from the drift layer 5. The further base layers 30, 30' may have the same thickness and doping concentration as the base layer 4 and the base layer 4 and further base layers 30, 30' may be manufactured simultaneously. The further base layers 30, 30' are drawn in the figures by a dashed line indicating that these layers are optional layers.

The well 8 has a higher maximum doping concentration than the base layer 3 (and the further base layers 30, 30', if such layers are present). The well 8 may have a maximum doping concentration, which is at least a factor of 10 higher than the maximum doping concentration of the base layer 3. In an exemplary embodiment, the well 8 may have a maximum doping concentration of at least $1*10^{18}$ cm$^{-3}$.

In another exemplary embodiment, n doped, further source layers 20, 20' are arranged in the second cell 15 between each further base layer 40, 40' and the second insulating layer 74, which further source layers 20, 20' adjoin the neighboured trench gate electrode 7, 7'. The further source layers 20, 20' extend to the emitter sided surface of the device like the source layer 2. The source layer 2 and further source layers 20, 20' may be produced simultaneously. The further source layers 20, 20' are drawn in the figures by a dashed line indicating that these layers are optional layers.

In another exemplary embodiment, each first cell 1, 1' has a first cell width 10, which shall be the distance between the two trench gate electrodes 7, 7' of each first cell 1, 1' and having a contact to the emitter electrode 9 in between the two trench gate electrodes 7, 7'. The first cell width 10 may be smaller than or equal to the gate layer thickness 76 to achieve proper blocking capability. Such a small cell width ensures low losses and a compact design of the device.

In another exemplary embodiment, in each second cell 15 the well 8 has a well separation distance 82 from the neighboured trench gate electrodes 7, 7', which well separation distance 82 is smaller than or equal to the first cell width 10 (of the neighboured first cells 1, 1'). This also results in a compact design of the device and provides proper blocking capability. An n doped buffer layer 50 with a doping concentration, which is higher than the doping concentration of the drift layer 5 may be arranged between the drift layer 5 and the collector layer 6, so that the n impurity concentration rises from the emitter sided part of the drift layer 5 towards the collector layer 6. The buffer layer 50 is drawn in the figures by a dashed line indicating that this layer is an optional layer.

The inventive emitter sided design can also be applied to a reverse conducting IGBT, in which in the same plane as the collector layer 6 (i.e. on the collector side 97 and lateral to the collector layer 6), an n doped short layer may be arranged. The short layer is thus arranged alternating to the collector layer 6. The short layer has a higher doping concentration than the drift layer 5. The collector layer 6 may comprise p doped regions and the short layer may comprise n doped regions, which regions alternative with each other The inventive semiconductor device is suitable for full or part stripes but can also be implemented in cellular designs of the active cells 1, 1'.

Exemplarily, the inventive semiconductor device can comprise a gate electrode design with a different numbers of first cells 1, 1' than second cells 15. For example, there may be less second cells 15 than first cells 1, 1' so that the density of active cells 100 versus total area is increased. In another alternative, more than one p well 8 is arranged between the active trenches 7, 7' (I,e, between two neighboured active first cells 1, 1'). Between two wells 8, the structure with the further base layer 30, 30' surrounded by the further enhancement layer 40, 40' (or solely the further enhancement layer 40) may be repeated.

"Lateral" shall mean in this description that two layers/regions are arranged in a same plane, which plane lies parallel to the emitter side. Within that plane the layers are arranged lateral (neighboured, side to side) or adjacent to each other, whereas the layers may have a distance from each other, i.e. another layer may be arranged between the two layers, but they may also be directly adjacent to each other, i.e. in touch to each other. "Lateral sides" of a layer shall be the sides of an object perpendicular to the emitter side 90.

Figure 1:
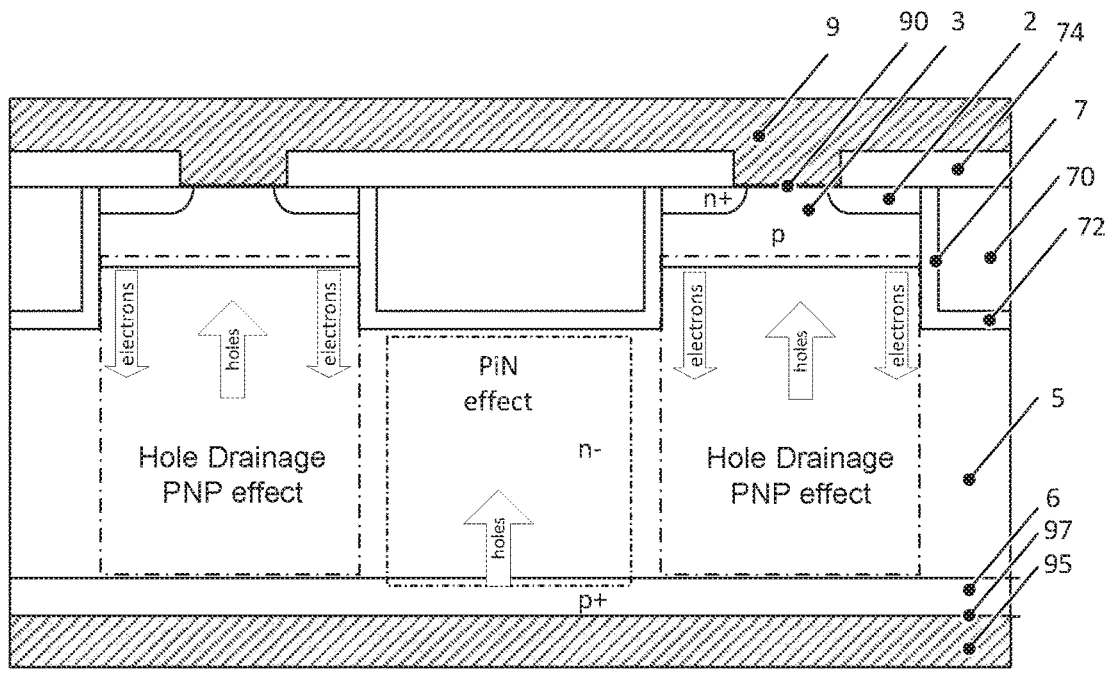
FIG. 1 shows an IGBT with a trench gate electrode according to the prior art.
Figure 2:
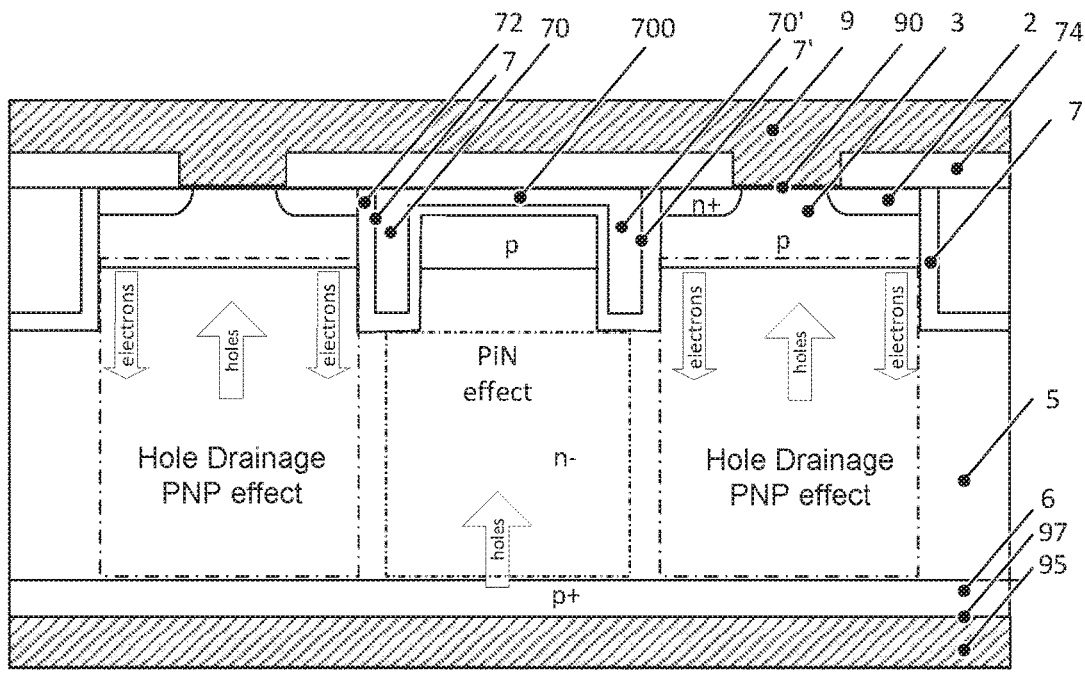
FIG. 2 shows another IGBT with a pitched trench gate electrode according to the prior art.
Figure 3:
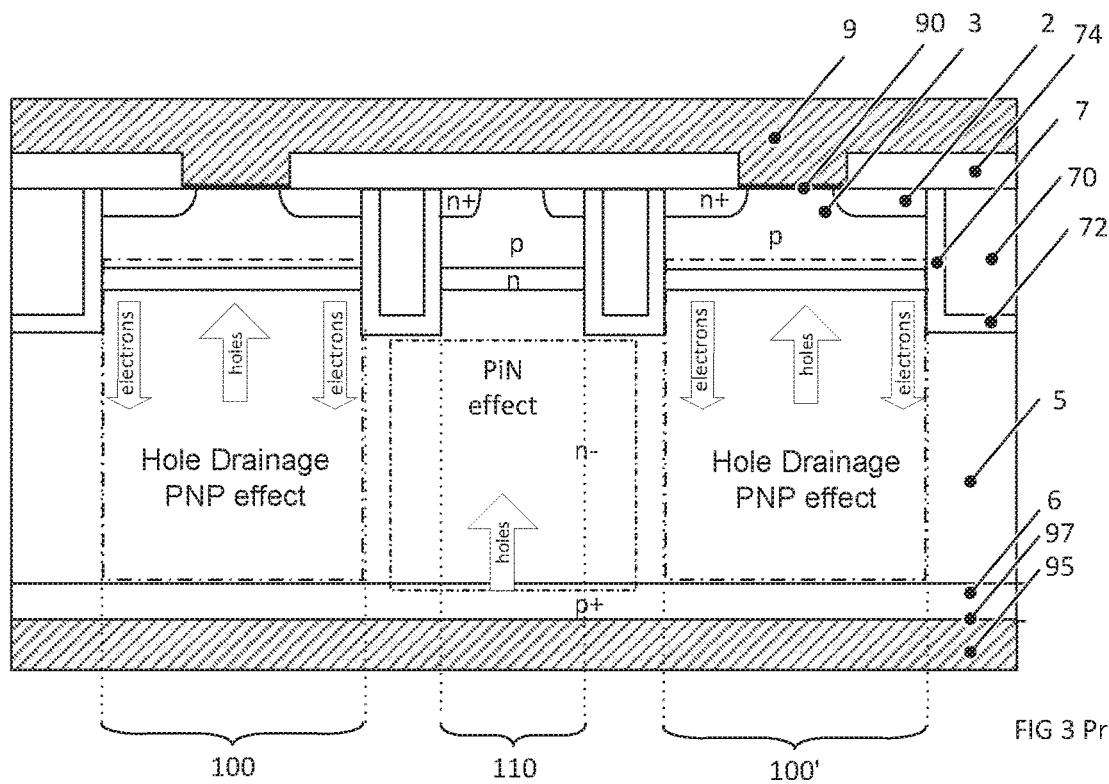
FIG. 3 shows another IGBT with a dummy cell according to the prior art.
Figure 4:
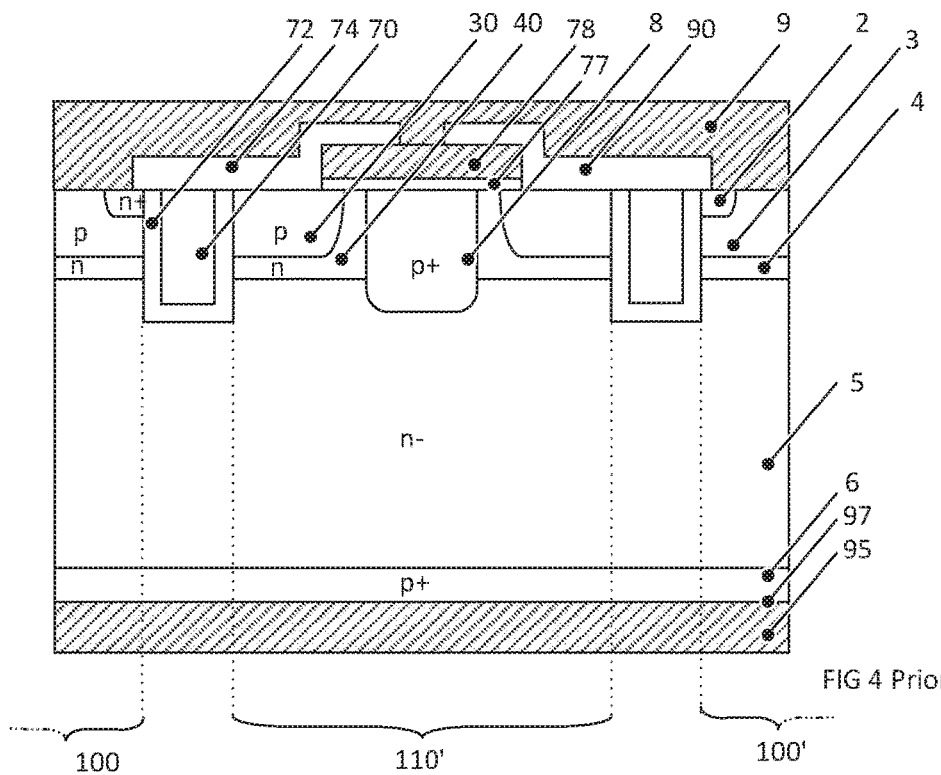
FIG. 4 shows another IGBT with a dummy cell according to the prior art.
Figure 9:
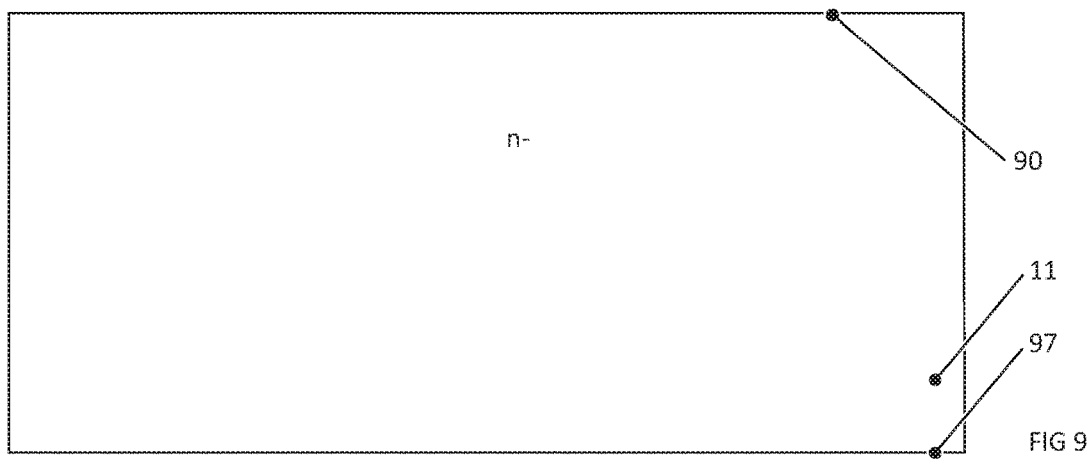
FIGS. 9 to 23 shows steps of a methods of manufacturing an inventive IGBT.
Figure 21:
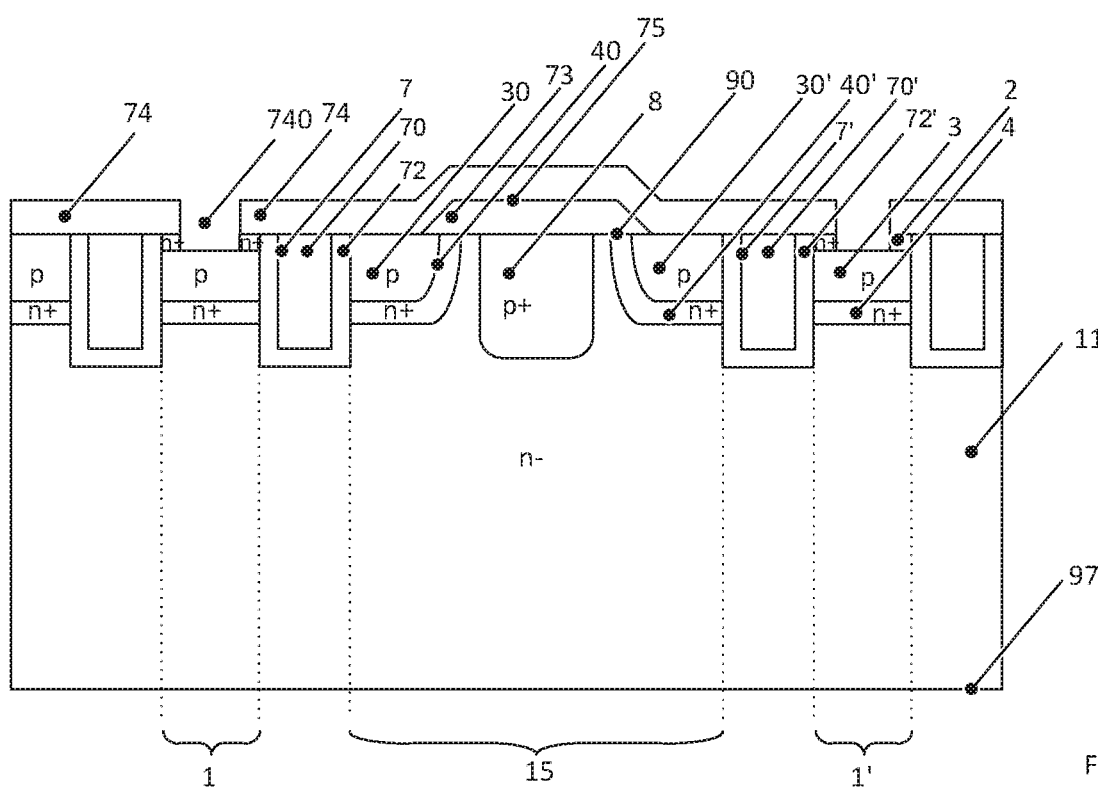
Figure 22:
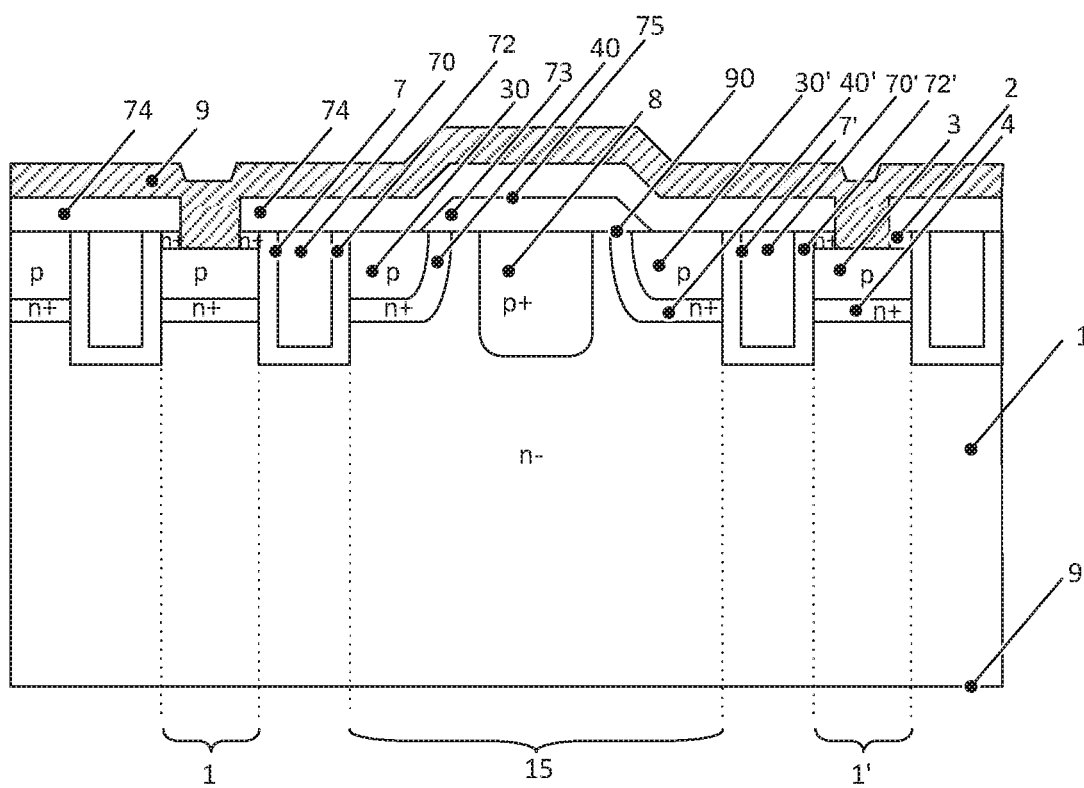
Figure 23:
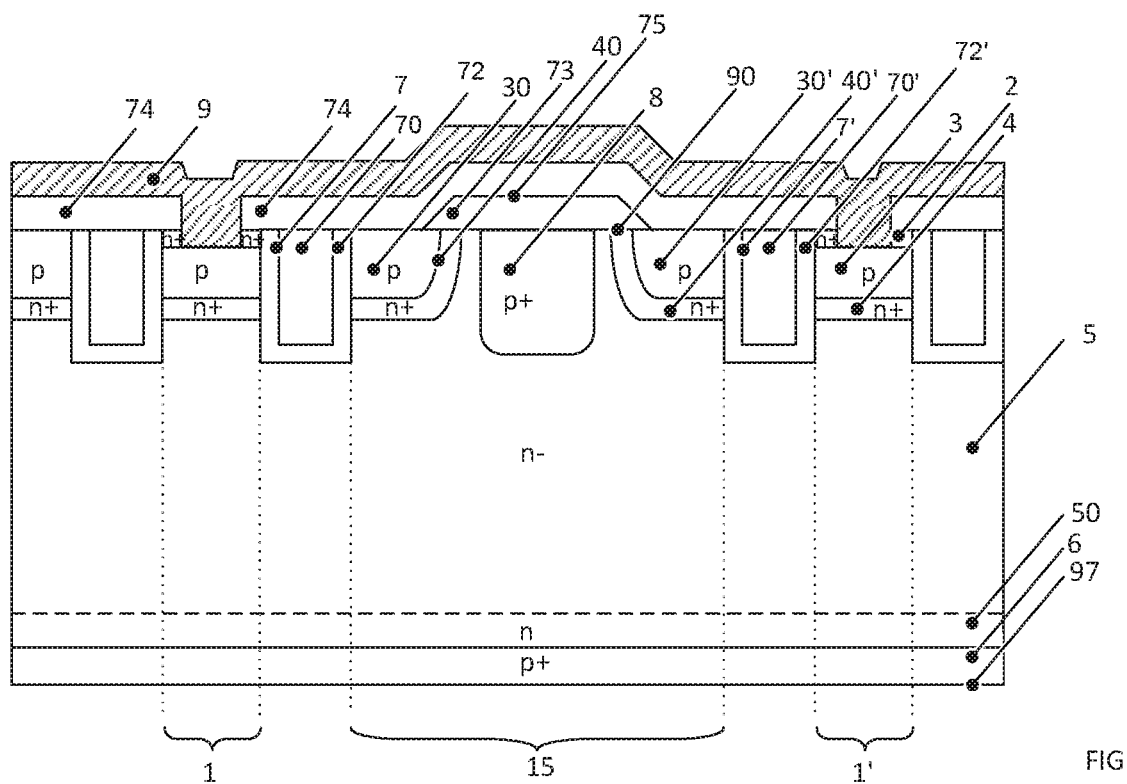

For manufacturing an inventive insulated gated bipolar transistor the following manufacturing steps are performed:
(a) providing a lowly n– doped wafer 11 having an emitter side 90 and a collector side 97 opposite to the emitter side 90 (FIG. 9),
(b) forming a well mask 84 having at least one well mask opening 86 on the emitter side 90,
  applying a p dopant as well dopant 85 on the emitter side 90 through the at least one well mask opening 86 (FIG. 10),
(c) removing the well mask 84,
(d) after step (b) and before a step (e) forming a well 8 by diffusing the well dopant (FIG. 1),
(e) applying a first insulating layer 73 having a thickness of at least 700 nm on top of the well 8, which projects, i.e. extends over lateral edges of the well 8 (FIG. 13),
(f) applying a trench mask 71 having a plurality of trench mask openings 710, 710' on the emitter side 90 in a region lateral to and being spaced apart from the well 8 (FIG. 14),
  forming a plurality of trench recesses 79, 79' by removing wafer material below the plurality of trench mask openings 710, 710' (FIG. 15),
  forming a gate insulating layer 72, 72' in each trench recess 79, 79' covering the trench recess walls 79, 79' (FIG. 16),
  forming a gate layer 70, 70' in each trench recess 79, 79' by filling each trench recess 79, 79' with an electrically conductive material (FIG. 17), thereby forming a plurality of trench gate electrodes 7, 7' comprising the gate layers 70, 70' and the gate insulating layers 72, 72',
(g) forming an enhancement layer 4 between two trench gate electrodes 70, 70' (having no well inbetween) and a further enhancement layer 40, 40' between the well 8 and a neighboured trench gate electrode 7, 7' by applying an enhancement layer dopant (n dopant) on the emitter side 90 using the first insulating layer 73 and the trench gate electrodes 7, 7' as an enhancement layer mask and diffusing the enhancement layer dopant (FIG. 18),
(h) forming a base layer 3 between two trench gate electrodes 7, 7' (having no well inbetween) and a further base layer 30, 30' between the well 8 and a neighboured trench gate electrode 7, 7' by applying a p dopant as base layer dopant on the emitter side 90 using the first insulating layer (73, 73') and the plurality of trench gate electrodes (7, 7') as a base layer mask and diffusing the base layer dopant to a lower depth than the enhancement layer dopant has been diffused so that the base layer 3 and the further base layer 30, 30' are separated from the drift layer 5 by the enhancement layer 4 and the further enhancement layer 40, 40' respectively (FIG. 19),
(i) forming a source layer 2 by applying an n dopant as source layer dopant on the emitter side 90 using the first insulating layer 73 (and the trench gate electrodes 7, 7') as a source layer mask and diffusing the source layer dopant (FIG. 20 or FIG. 24),
(j) applying a second insulating layer 74 having a thickness of at least 700 nm, which covers the first insulating layer 73 and extends to and projects the neighboured trench gate electrodes 7, 7', wherein the second insulating layer 74 has a second insulating layer opening 740 on top of the source layer 2, which second insulating layer opening 740 is spaced apart from the edges of the neighboured trench gate electrodes 7, 7' so that the source layer 2 remains at a lateral side of the trench gate electrodes 7, 7' facing away from the well 8, wherein the first insulating layer 73 and the second insulating layer 74 form an insulating layer stack 75, which has a thickness on top of the well 8 of a first insulating layer thickness and a second insulating layer thickness and a thickness on top of the gate layer 70, 70' of the second insulating layer thickness (i.e. without the first insulating thickness) (FIG. 21),
(k) removing wafer material (i.e. from the source layer) at least to a depth of the base layer 3 using the second insulating layer 74 with the second insulating layer opening 740 as an emitter electrode mask (FIG. 21) so that the source layer 2 remains at the lateral sides of the trench gate electrodes 7, 7' and the source layer 2 attaches the trench gate electrodes 7, 7',
  forming a metal emitter electrode 9 by applying an electrically conductive material on the emitter side 90 in the second insulating layer opening 740 so that the metal emitter electrode 9 contacts the base layer 3 and the source layer 2 (FIG. 22).

Figure 10:
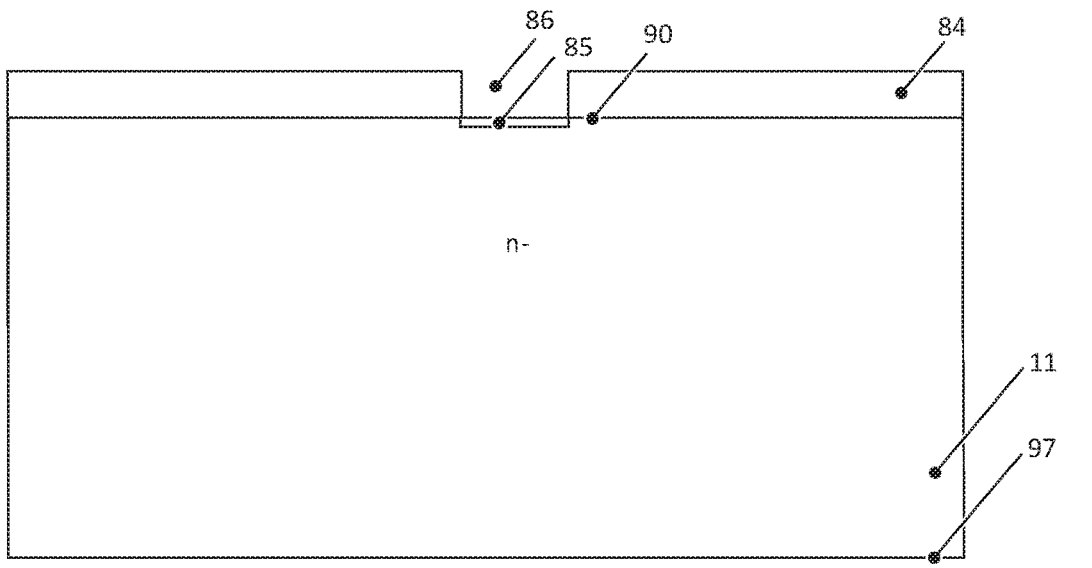

In step (b) a well mask 84 is formed having at least one well mask opening 86 on the emitter side 90 (FIG. 10). The well mask 84 may be formed by applying a continuous layer on the emitter side and then removing material from the well mask 84 to form a well mask opening 86 (or well mask openings), which uncover the wafer in the well mask opening 86. The well mask may be made of photoresist. The at least one well mask opening 86 is arranged in a central area of a second cell 15 in the finalized IGBT. The p dopant is applied into the wafer on the emitter side 90 at the at least one well mask opening 86.

Figure 11:
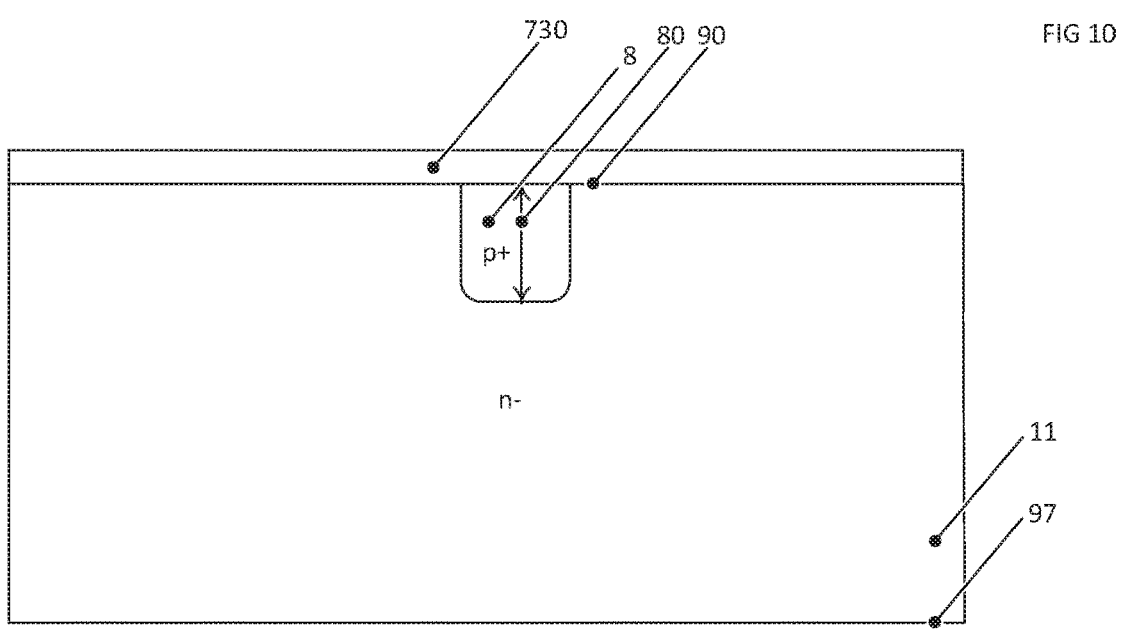

The well dopant 85 is then diffused in a heating step, thereby forming the well 8. The well mask 84 may be removed before the heating step (FIG. 11).

Afterwards, a first insulating layer 73 is applied having a thickness of at least 700 nm on top of the well 8, which first insulating layer 73 extends over lateral edges of the well 8

Figure 12:
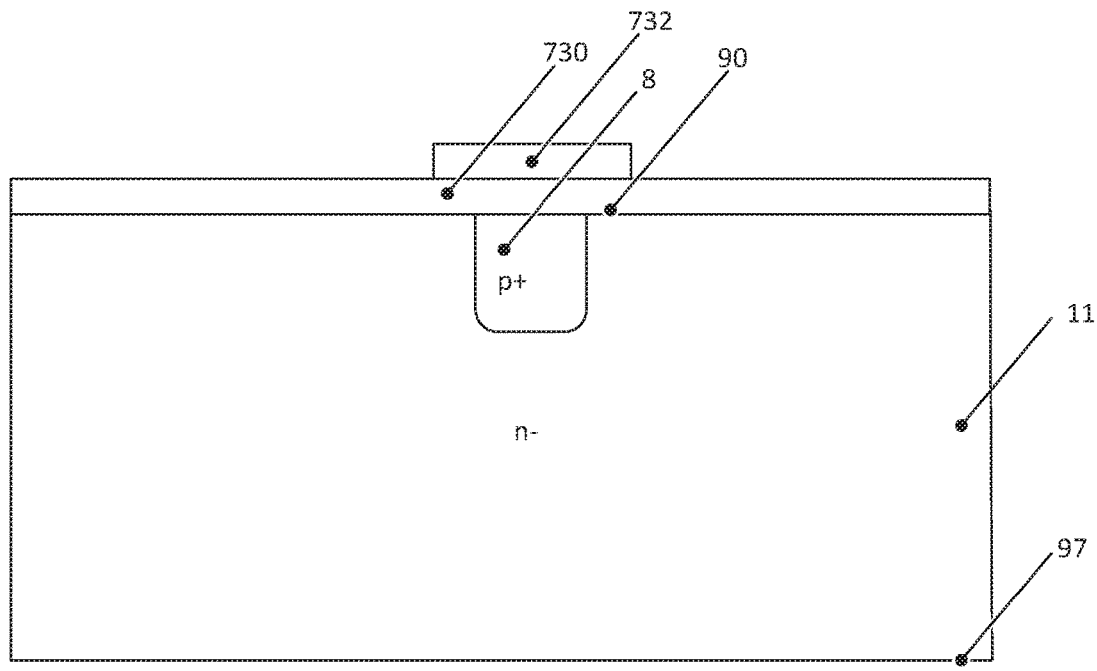
Figure 13:
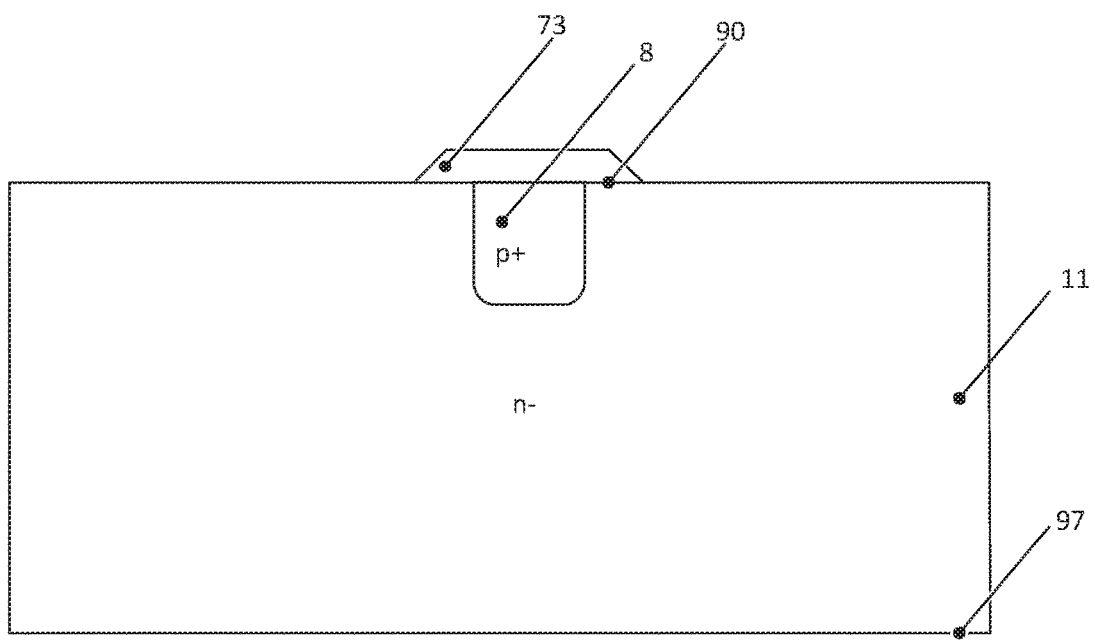

(FIG. 13). The first insulating layer 73 may have a thickness of up to 1200 nm. The lower thickness limit is given by the goal to achieve a good insulation between the well 8 and the metal emitter electrode 9 and the upper thickness limit is given by limits in the manufacturing method, i.e. in a single thermal oxidation step the oxide layer can be grown up to about 1200 nm. The first insulating layer 73 may be applied by a thermal oxidation step, which oxidation may simultaneously be used for diffusing the p well dopant. Such an oxide layer 730 is also called a field oxide layer. A thermal oxide layer is formed as a continuous oxide layer over the whole emitter sided surface of the wafer (FIG. 11). For a field oxide layer 730, an insulating layer mask 732 has to be applied to remove the oxide layer 730 in areas lateral to the well 8 (FIG. 12). The well 8 is projected by the remaining field oxide layer (first insulating layer 73) to ensure a good separation of the p well 8 and the further base layer 3/trench gate electrode 7, 7' in the finalized semiconductor device (FIG. 13). Projected shall mean that the first insulating layer 73 is wider than each lateral side/overlaps the well 8 by an overlap distance which is exemplarily at least 3 μm.

Figure 14:
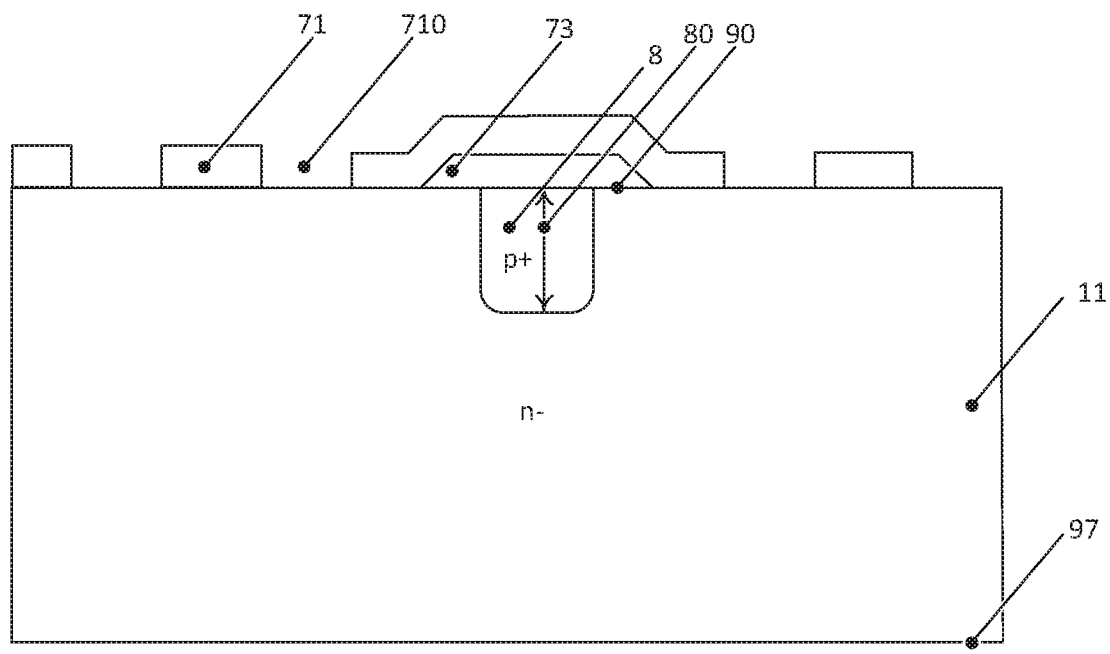
Figure 15:
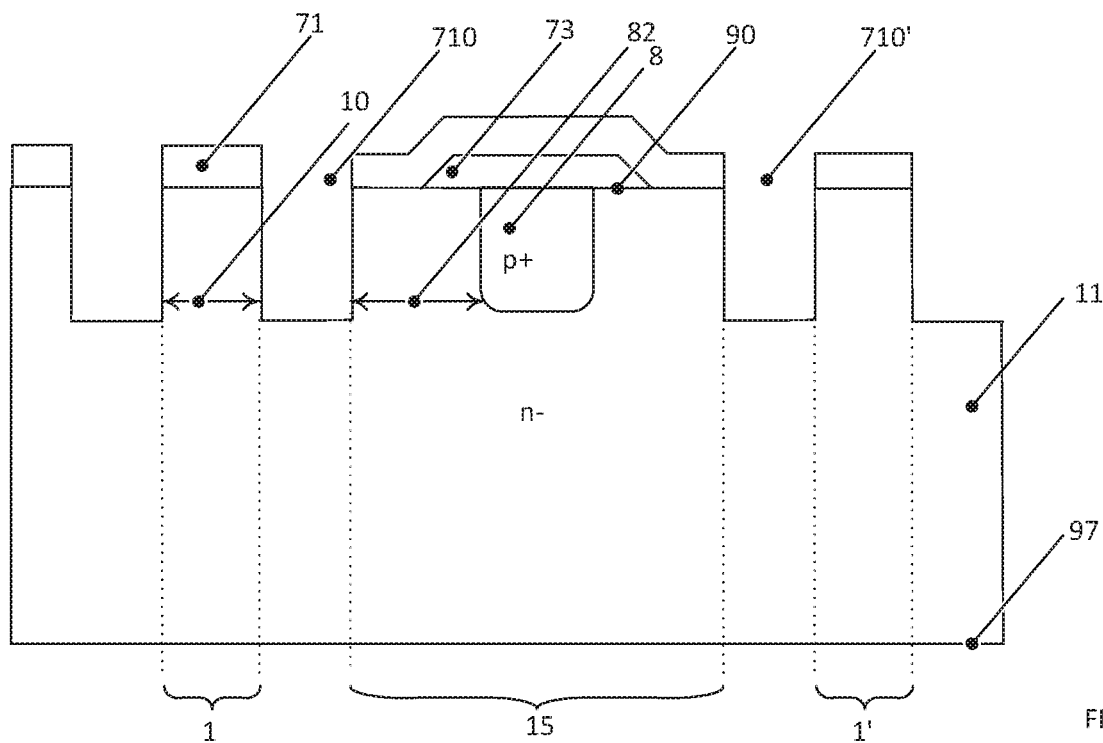
Figure 16:
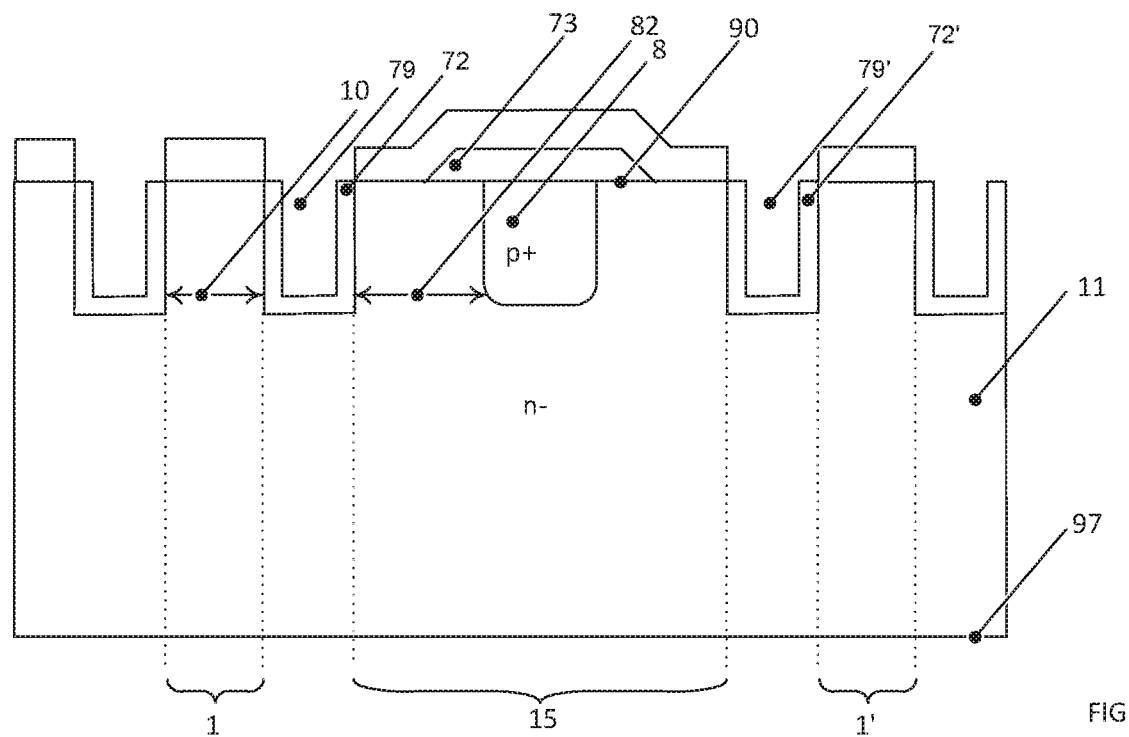
Figure 17:
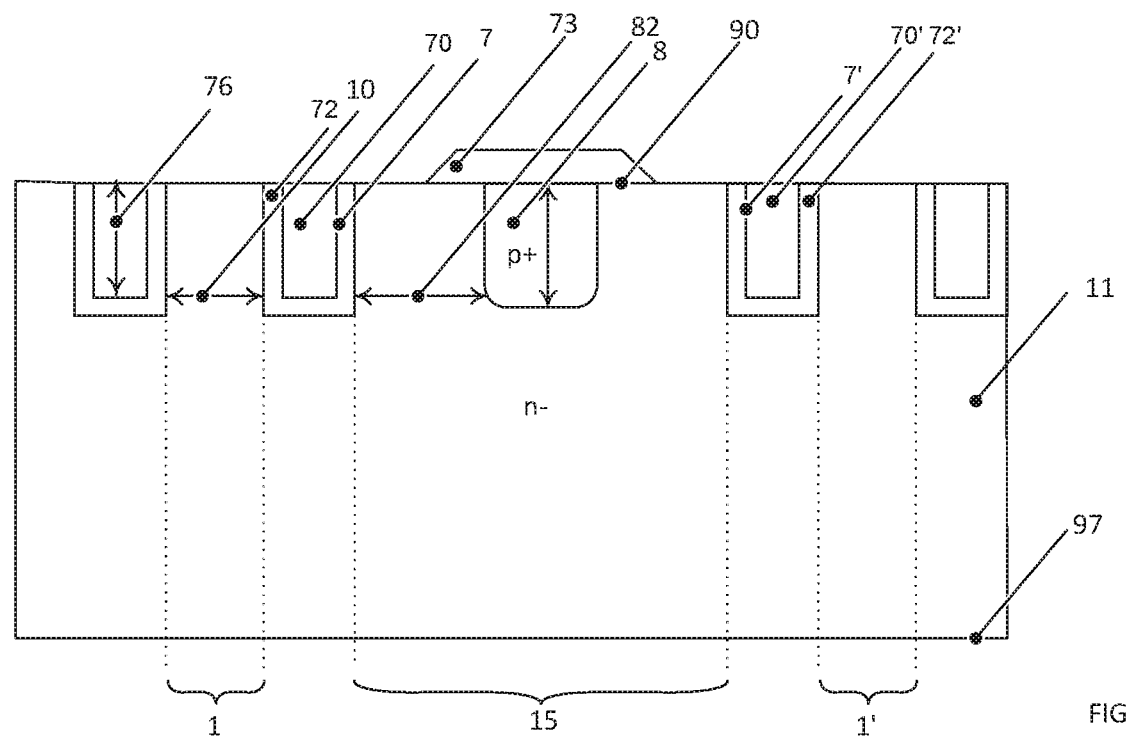

Now, a trench mask 71 (also called hard mask) is applied having a plurality of trench mask openings 710 on the emitter side 90 laterally to the well 8 and to the first insulating layer 73 (FIG. 14). A plurality of trench recesses 79, 79' are formed by removing wafer material below the at least two trench mask openings 710. Below refers here to a direction perpendicular to the emitter side 90, i.e. in projection to the trench mask opening 710. Exemplarily, the trench recesses 79, 79' are etched into the wafer in/below the trench mask openings 710 (FIG. 15). A gate insulating layer 72, 72' is formed in each trench recess 79, 79', which covers the trench recess walls (lateral trench recess walls and trench recess bottom) (FIG. 16). Then a gate layer 70, 70' is formed by filling each trench recess 79, 79' with an electrically conductive material (FIG. 17). This material may be a polysilicon. The polysilicon may be applied as a continuous layer, which is then selectively removed from the wafer surface leaving the polysilicon in the trench recesses 79, 79'. Optionally, there may also polysilicon remain at an edge of a first cells 1 (active cells) for a contact of the gate layers 70, 70' to a gate runner. The gate layers 70, 70' form together with the surrounding gate insulating layers 72, 72' trench gate electrodes 7, 7'.

The first insulating layer 73 together with the trench gate electrodes 7, 7' are now used as an enhancement layer mask with the first insulating layer islands 73 acting as absorbing regions. Also in the area of the trench gate electrode 7 (with gate layer 70, 70' and gate insulating layer 72, 72') dopants are absorbed and therefore, no doped layer is formed in the trench gate electrode 7, 7' in the following dopant applying steps.

An n dopant is applied, exemplarily implanted on the emitter side 90. "On" in this context shall refer to the dopant being applied onto (in case of dopant deposition) or into (in case of dopant implantation) the emitter sided part of the wafer.

Figure 18:
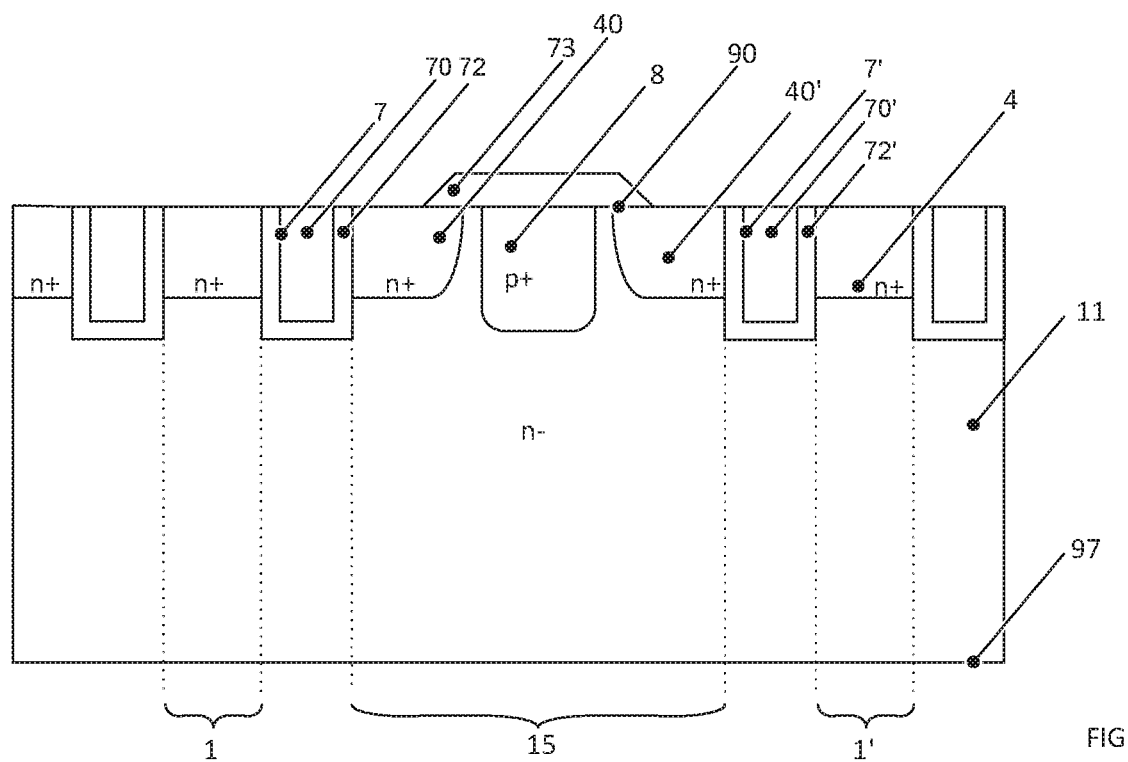
Figure 19:
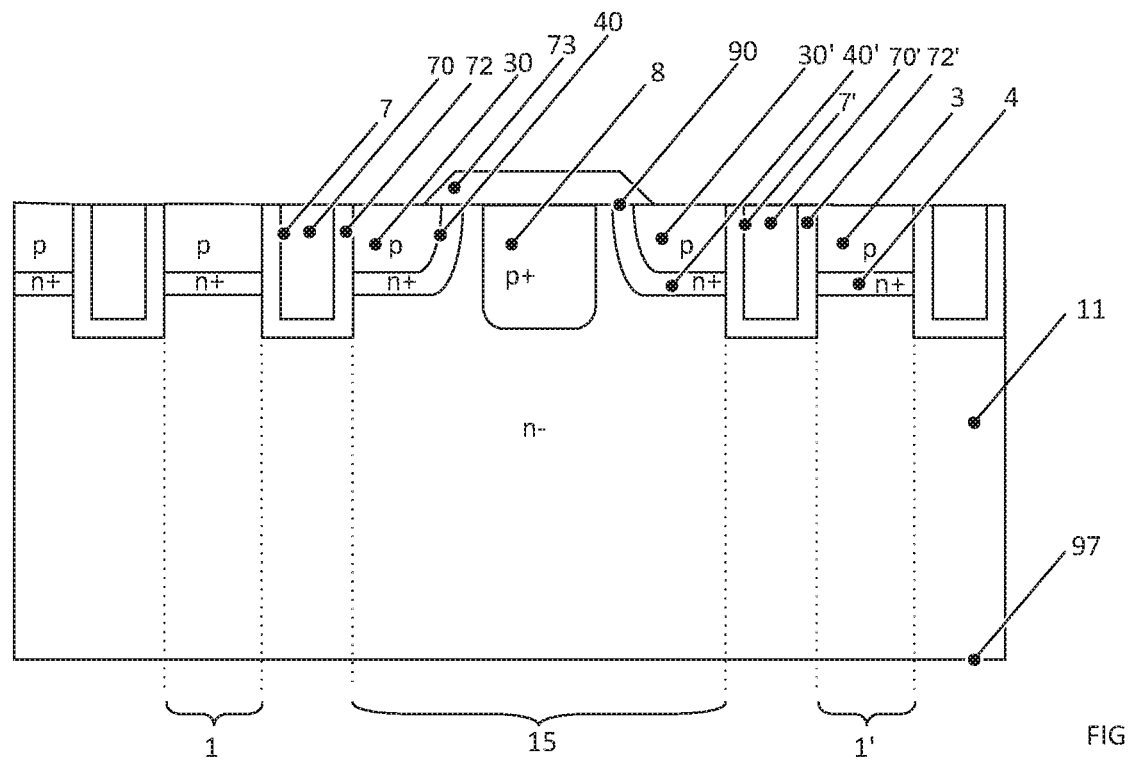

An n dopant is applied as enhancement layer dopant, exemplarily by deposition or implantation, on the emitter side 90 using the first insulating layer 73 and the trench gate electrodes 7, 7' as an enhancement layer mask. Afterwards, the enhancement layer dopant is diffused (FIG. 18). Thereby, an enhancement layer 4 is formed between two neighboured trench gate electrodes 7, 7' (between which no well is arranged) and a further enhancement layer 40, 40' is arranged between the well 8 and a neighboured gate layer 70, 70'. Depending on the width, by which the first insulating layer projects the well 8 and by the diffusion conditions, the further enhancement layers 40, 40' may touch the well 8 or they may be separated from the well 8 by the drift layer 5 (part of the wafer 11 with not amended doping concentration).

A p dopant is applied as base layer dopant, exemplarily by deposition or implantation, on the emitter side 90 using the first insulating layer 73 and the trench gate electrodes 7, 7' as a base layer mask, i.e. the same mask is used for forming the enhancement layers 4, 40, 40' and the base layers 3, 30, 30'. Afterwards, the base layer dopant is diffused. Thereby, a base layer 3 is formed between two neighboured trench gate electrodes 7, 7', i.e. in the first cell 1 (between which no well is arranged) and a further base layer 30, 30' is arranged between the well 8 and a neighboured gate layer 70, 70', i.e. in the second cell 15. The enhancement layer dopant is further diffused into the wafer than the base layer dopant so that the resulting enhancement layer 4 in the finalized IGBT surrounds the base layer 3 such that the base layer 3 is separated from the drift layer 2 (i.e. the part of the wafer having non amended doping concentration) and the resulting further enhancement layer 40, 40' in the finalized IGBT surrounds the further base layer 30, 30' such that the further base layer 30, 30' is separated from the drift layer 2.

Figure 24:
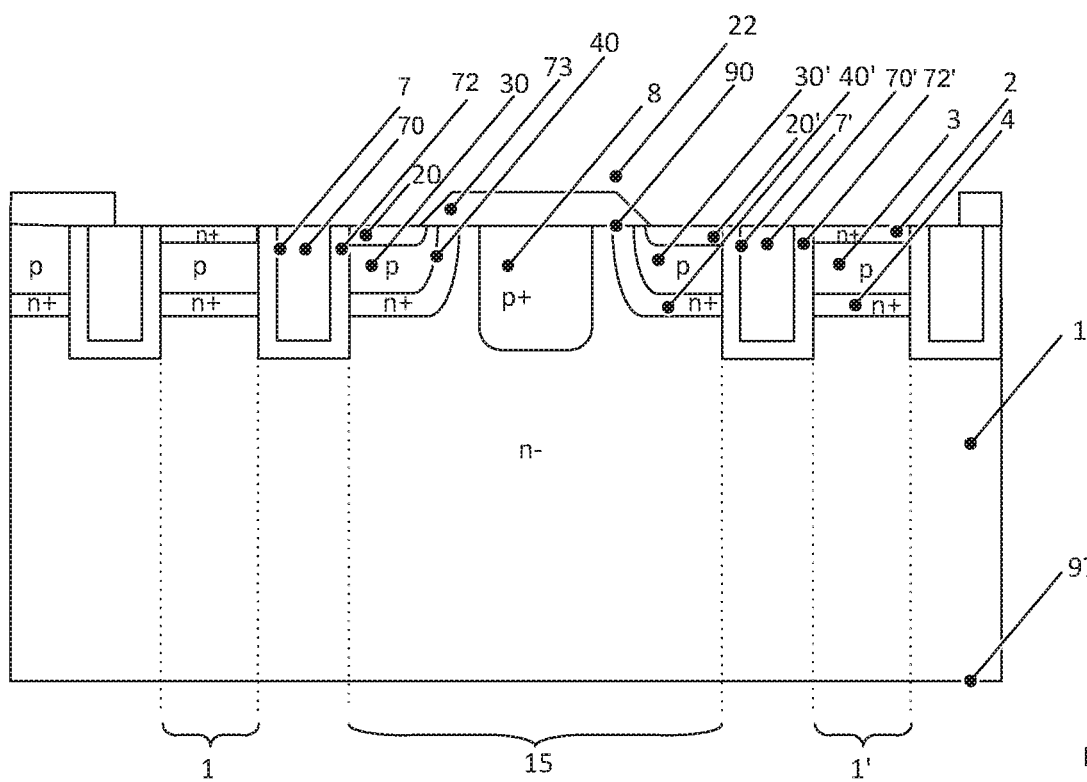
FIG. 24 shows an alternative step in an inventive method of manufacturing an inventive IGBT.

Afterwards, an n dopant is applied as source layer dopant, exemplarily by deposition or implantation, on the emitter side 90 using the first insulating layer 73 and the trench gate electrodes 7, 7' as a source layer mask (i.e. no further mask is applied) (FIG. 24). Afterwards, the source layer dopant is diffused. Thereby, a source layer 2 is formed in the first cell 1 between two neighboured trench gate electrodes 7, 7' (between which no well is arranged) and further source layers 20, 20' are formed in the second cell 15 between the trench gate electrodes 7, 7' and the well 8. The base layer dopant is further diffused into the wafer than the source layer dopant so that the resulting base layer 3 in the finalized IGBT surrounds the source layer 2 such that the source layer 2 is separated from the enhancement layer 4. In the second cell 15, the further source layer 20, 20' is separated from the well 8 by the further base layer 30, 30' and the further enhancement layer 40, 40'.

Figure 20:
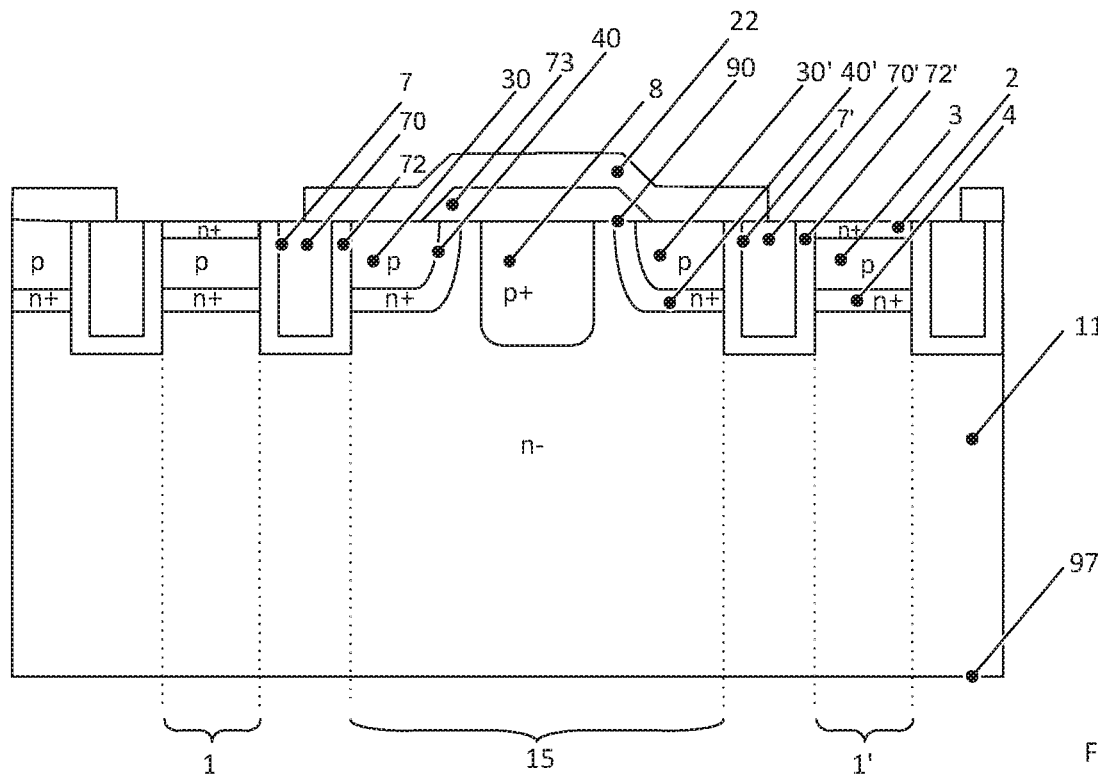

Before applying the source dopant, a source layer mask 22, exemplarily a photoresist mask, may be applied in the second cell 15, which covers the whole second cell, i.e. the well 8 and the region between the well 8 and the neighboured trench gate electrodes 7, 7' (i.e. the further base layer 40' and the further enhancement layer 40' and if the drift layer extends to the wafer surface between the well 8 and the further enhancement layer also the drift layer, i.e. the source layer mask 22 covers the layers in the second cell 15) so that no further source layer is formed in the second cell 15 (FIG. 20). In this case, the source layer dopant is applied only in the first cell 1 to form a source layer 2.

Now, a second insulating layer 74 having a thickness of at least 700 nm is applied, which covers the first insulating layer 73 and extends to and projects the neighboured trench gate electrodes 7, 7', thus the second insulating layer 74 covers the whole second cell 15 and extends further within the first cell 1 so that the second insulating layer 74 projects the trench gate electrodes 7, 7' and is terminated in a region above the source layer 2, but does not completely cover the source layer 2. The lower thickness limit is given by the goal to achieve a good insulation between the polysilicon gate electrode and the metal emitter electrode 9 and the upper thickness limit is given by limits in the manufacturing method. The second insulating layer 74 has a second insulating layer opening 740 on top of the source layer 2. The second insulating layer opening 740 is spaced apart from the neighboured trench gate electrodes 7, 7' so that the source layer 2 is covered by the second insulating layer 74 in a region attached to the neighboured trench gate electrode 7, 7' and the source layer 2 remains at a lateral side of the trench gate electrodes 7, 7' facing away from the well 8. Exemplarily, the second insulating layer 74 is an inter level dielectric (ILD) layer, which may be formed as a low temperature oxide layer such as a PSG (phosphosilicate glass), BPSG (borophosphosilicate glass) or TEOS (tetra ethyl ortho silicate) layer. Such insulating layers can be formed on the wafer by a low temperature process (temperatures between 400° C. and 500° C.) so that the doped layers formed before are not negatively influenced by the temperature when forming the second insulating layer 74.

The first insulating layer 73 and the second insulating layer 74 form an insulating layer stack 75, which has a thickness on top of the well 8 (thickness of first and second insulating layer), which is higher than its thickness above the trench gate electrodes 7, 7' (thickness of second insulating layer). Such an insulating layer stack 75 with different thicknesses enables the device to be manufactured with self-aligned masks. Furthermore, due to the stack being produced by two insulating layers on top of each other it is possible to achieve a higher total thickness on top of the well, by which the capacitance can be reduced to less than 2.5 nF/cm² (i.e. with a thickness of at least 1400 nm above the well 8, wherein a thickness of 1400 nm corresponds to a capacitance of 2.5 nF/cm²).

The opening 740 in the second insulating layer 74 may be formed by applying a mask on top of the second insulating layer with an opening on top of the source layer and spaced apart from the edges of the trench gate electrodes 7, 7'.

Then wafer material is etched away down to a depth in the base layer 3, so that below the opening 740 the n doping of the source layer is removed completely, so that the source layer 2 only remains between the lateral sides of the trench gate electrodes 7, 7' and the openings 740 of the second insulating layer 74. Now a metal emitter electrode 9 is formed by applying an electrically conductive material on the emitter side 90 on the second insulating layer 74 and in the second insulating layer opening 740 so that the metal emitter electrode 9 contacts the base layer 3 (in a direction parallel to the emitter side 90, the emitter side 90 being a plane through the top surface of the doped semiconductor layers, which is in this case the top surface of the source layer 2) and the source layer 2 (in a direction perpendicular to the emitter side 90). Thus, the interface between the metal emitter electrode 9 and the base layer 3 is arranged recessed to the emitter side 90.

There is no insulating layer arranged on the wafer, which is sandwiched between two parts of the metal emitter electrode (which could lead to voltage drops in the metal emitter electrode). The insulating layer stack 75 is arranged completely below the metal emitter electrode 9 (and all electrically directly connected electrically conductive elements such as the polysilicon plate in prior art devices). The full insulating layer stack thickness serves to separate the metal emitter electrode 9 (i.e. all electrically conductive elements put on emitter potential) from the doped layers in the second cell 15.

In another embodiment, the conductivity types are switched, i.e. all layers of the first conductivity type are p type (e.g. the drift layer 5, source layer 2 and enhancement layer 4) and all layers of the second conductivity type are n type (e.g. base layer 3, well 8).

It should be noted that the term "comprising" does not exclude other elements or steps and that the indefinite article "a" or "an" does not exclude the plural. Also elements described in association with different embodiments may be combined. It should also be noted that reference signs in the claims shall not be construed as limiting the scope of the claims.

LIST OF REFERENCE SYMBOLS 1, 1' first cell
10 first cell width
11 wafer
15 second cell
100 active cell
110, 110' dummy cell
2 source layer
20, 20' further source layer
22 source layer mask
3 base layer
30, 30' further base layer
4 enhancement layer
40, 40' further enhancement layer
5 drift layer
50 buffer layer
6 collector layer
7, 7' trench gate electrode
70, 70' gate layer
700 layer
71 trench mask
710 trench mask opening
72, 72' gate insulating layer
73 first insulating layer
730 oxide layer
732 insulating layer mask
74 second insulating layer
740 second insulating layer opening
75 insulating layer stack
76 gate layer thickness
77 insulating film
78 poly silicon plate
79 trench recess
8 well
80 well layer thickness
82 well separation distance
84 well mask
86 well mask opening
9 metal emitter electrode
90 emitter side
95 collector electrode
97 collector side

The invention claimed is:
1. An insulated gated bipolar transistor comprising at least two first cells, each of which having layers from a metal emitter electrode on an emitter side and a collector electrode on a collector side opposite to the emitter side:
  a source layer of a first conductivity type,
  a base layer of a second conductivity type, which is different from the first conductivity type, wherein the source layer and the base layer contact the metal emitter electrode,
  an enhancement layer of the first conductivity type having higher doping concentration than a drift layer, wherein the base layer separates the source layer from the enhancement layer, the drift layer of the first conductivity type, wherein the enhancement layer separates the base layer from the drift layer, a collector layer of the second conductivity type, which is arranged between the drift layer and the collector electrode and which electrically contacts the collector electrode, two trench gate electrodes, each of which comprises an electrically conductive gate layer, which is arranged lateral to the base layer, extends deeper into the drift layer than the base layer and has a gate layer thickness, and a gate insulating layer, which separates the gate layer from any doped layer, wherein a channel is formable between the source layer, the base layer, the enhancement layer and the drift layer, the insulated gate bipolar transistor comprising at least one second cell which is arranged between two neighboring first cells of the at least two first cells and which has a layer of the following layer on the emitter side:

a well of the second conductivity type, which is arranged between the two trench gate electrodes which are arranged in of the neighbouring first cells, which well extends at least to the gate layer thickness, wherein further enhancement layers of the first conductivity type having higher doping concentration than the drift layer are arranged between the well and the two trench gate electrodes such that the further enhancement layers extend to the emitter side, an insulator layer stack is arranged on top of the a least one second cell on the emitter side to insulate the at least one second cell and the two trench gate electrodes from the metal emitter electrode, which consists of a first insulating layer and a second insulating layer, wherein the insulator stack has a first thickness on top of the well of a thickness of the first layer plus a thickness of the second insulating layer and a second thickness on top of the gate layer of the thickness of the second insulating layer, wherein the thickness of the first insulating layer and the thickness of the second insulating layer is each at least 700 nm.

2. The insulated gate bipolar transistor according to claim 1, wherein the further enhancement layers adjoin the well so that the drift layer is separated from the second insulating layer in the at least one second cell by the further enhancement layers.

3. The insulated gated bipolar transistor according to claim 2, wherein further base layers of the second conductivity type are arranged in the at least one second cell and adjoin the neighbouring trench gate electrodes, wherein the further enhancement layers separate the further base layers from the drift layer.

4. The insulated gated bipolar transistor according to claim 2, wherein each first cell of the at least two first cells has a first cell width between the two trench gate electrodes of the at least two first cells, wherein the first cell width is smaller than or equal to the gate layer thickness.

5. The insulated gated bipolar transistor according to claim 4, wherein in each of the at least one second cell the well has a well separation distance from the two trench gate electrodes, which well separation distance is smaller than or equal to the first cell width.

6. The insulated gate bipolar transistor according to claim 1, wherein the drift layer extends to the second insulating layer in an area between the well and the further enhancement layers.

7. The insulated gated bipolar transistor according to claim 6, wherein further base layers of the second conductivity type are arranged in the at least one second cell and adjoin the neighbouring trench gate electrodes, wherein the further enhancement layers separate the further base layers from the drift layer.

8. The insulated gated bipolar transistor according to claim 6, wherein each first cell of the at least two first cells has a first cell width between the two trench gate electrodes of the first cell, wherein the first cell width is smaller than or equal to the gate layer thickness.

9. The insulated gated bipolar transistor according to claim 8, wherein in each second cell the well has a well separation distance from the two trench gate electrodes, which well separation distance is smaller than or equal to the first cell width.

10. The insulated gated bipolar transistor according to claim 1, wherein further base layers of the second conductivity type are arranged in the at least one second cell and adjoin the two trench gate electrodes, wherein the further enhancement layers separate the further base layers from the drift layer.

11. The insulated gated bipolar transistor according to claim 10, wherein further source layers of the first conductivity type are arranged in the at least one second cell between the further base layer and the second insulating layer, which further source layers adjoin the two trench gate electrodes.

12. The insulated gated bipolar transistor according to claim 11, wherein each first cell of the at least two first cells has a first cell width between the two trench gate electrodes of the first cell, wherein the first cell width is smaller than or equal to the gate layer thickness.

13. The insulated gated bipolar transistor according to claim 1, wherein each of the at least two first cells has a first cell width between the two trench gate electrodes of at least two first cells the first cells, wherein the first cell width is smaller than or equal to the gate layer thickness.

14. The insulated gated bipolar transistor according to claim 1, wherein in each of the at least one second cell the well has a well separation distance from the neighbouring trench gate electrodes, which well separation distance is smaller than or equal to the first cell width.

15. The insulated gated bipolar transistor according to claim 1, wherein a buffer layer of the first conductivity type having a higher doping concentration than the drift layer is arranged between the drift layer and the collector layer.

16. The insulated gated bipolar transistor according to claim 1, wherein the insulated gated bipolar transistor further comprises a short layer of the first conductivity type, which is arranged on the collector side laterally to the collector layer, which short layer has a higher doping concentration than the drift layer.

17. The insulated gated bipolar transistor according to claim 1, wherein the enhancement layer and the further enhancement layers have a maximum doping concentration between $5*10^{15}$ to $5*10^{18}$ cm$^{-3}$.

18. The insulated gated bipolar transistor according to claim 1, wherein the well has a maximum doping concentration of at least $1*10^{18}$ cm$^{-3}$.

19. The insulated gated bipolar transistor according to claim 1, wherein the well has a maximum doping concentration, which is at least a factor of 10 higher than the maximum doping concentration of the base layer.

20. A method of manufacturing an insulated gated bipolar transistor comprising the following manufacturing steps:

(a) providing a wafer of a first conductivity type having an emitter side and a collector side opposite to the emitter side,
(b) forming a well mask having at least one well mask opening on the emitter side,
   applying a well dopant of a second conductivity type which is different from the first conductivity type through the at least one well mask opening,
(c) removing the well mask,
(d) after step (b) and before a step (e) forming a well by diffusing the well dopant,
(f) applying a first insulating layer having a thickness of at least 700 nm on top of the well, which extends over a lateral edge of the well,
(f) applying a trench mask having a plurality of trench mask openings on the emitter side,
   forming a trench recess by removing wafer material in each trench mask opening,
   forming a gate insulating layer in each trench recess covering the trench recess walls,
   forming a gate layer in each trench recess by filing each trench recess with an electrically conductive material, thereby forming a plurality of trench gate electrodes comprising the gate layers and the gate insulating layers,
(g) forming an enhancement layer between two trench gate electrodes and a further enhancement layer between the well and a neighbouring trench gate electrode of the plurality of trench gate electrodes by applying an enhancement layer dopant of the first conductivity type on the emitter side using the first insulating layer and the plurality of trench gate electrodes as an enhancement layer mask and diffusing the enhancement layer dopant,
(h) forming a base layer between the two trench gate electrodes and a further base layer between the well and a trench gate electrode of the neighbouring trench gate electrodes of the plurality of trench gate electrodes by applying a base layer dopant of the second conductivity type on the emitter side and diffusing the base layer dopant using the first insulating layer and the plurality of trench gate electrodes as a base layer mask,
(i) forming a source layer by applying a source layer dopant of the first conductivity type on the emitter side and diffusing the source layer dopant using at least the first insulating layer and the plurality of trench gate electrodes as a source layer mask,
(j) applying a second insulating layer having a thickness of at least 700 nm, which covers the first insulating layer and extends to and projects over the neighbouring trench gate electrodes and having at least one second insulating layer opening on top of the source layer, which at least one second insulating layer opening is spaced apart from an edge of the gate insulating layer, wherein the first insulating layer and the second insulating layer form an insulating layer stack, which has a thickness on top of the well of a first and second insulating layer thickness and a thickness on top of the gate layer of the second insulating layer thickness,
(k) removing wafer material at least to a depth of the base layer using the second insulating layer as a emitter electrode mask so that the source layer remains at a lateral side of the neighbouring trench gate electrode facing away from the well,
forming a metal emitter electrode by applying an electrically conductive material at the emitter side in the second insulating layer opening so that the metal emitter electrode contacts the base layer and the source layer.

* * * * *